United States Patent [19]

Matsushita et al.

[11] Patent Number: 5,751,029
[45] Date of Patent: May 12, 1998

[54] FIELD-EFFECT SEMICONDUCTOR DEVICE HAVING HETEROJUNCTION

[75] Inventors: Shigeharu Matsushita, Katano; Daijirou Inoue, Kyoto; Kohji Matsumura, Hirakata; Minoru Sawada, Yawata; Yasoo Harada, Hirakata, all of Japan

[73] Assignee: Sanyo Electric Co., Ltd., Osaka-fu, Japan

[21] Appl. No.: 651,340

[22] Filed: May 17, 1996

[30] Foreign Application Priority Data

May 18, 1995 [JP] Japan ................... 7-120280

[51] Int. Cl.$^6$ ............... H01L 31/0328; H01L 31/0336; H01L 31/072; H01L 31/109
[52] U.S. Cl. .................... 257/194; 257/24; 257/192
[58] Field of Search ................ 257/12, 14, 192, 257/194

[56] References Cited

U.S. PATENT DOCUMENTS

| 5,326,995 | 7/1994 | Ohori .......................... 257/194 |
| 5,373,168 | 12/1994 | Ando et al. .................. 257/24 |
| 5,404,032 | 4/1995 | Sawada et al. ............... 257/192 |

OTHER PUBLICATIONS

Tekumitsu, Japanese Journal of Applied Physics vol. 29, No. 5, May 1990, pp. L698–L701.
Sawada et al, Japanese Journal of Applied Physics vol. 30, No. 12B, Dec. 1991, pp. 3837–3839.
Sawada et al.; IEEE Electron Device Letters vol. 14, No. 7, Jul. 1993.
Sawada et al., Japanese Journal of Applied Physics vol. 34, pp. 1168–1171, Part 1, No. 2B, Feb. 1995.
Matsushita et al., Extended Abstracts of the 1995 International Conference on Solid State Devices and Materials, Osaka, pp. 419–421 no month.

Primary Examiner—Sara W. Crane
Assistant Examiner—Douglas A. Wille
Attorney, Agent, or Firm—Armstrong, Westerman, Hattori, McLeland & Naughton

[57] ABSTRACT

An undoped $Al_{0.22}Ga_{0.78}As$ layer, an undoped $In_{0.2}Ga_{0.8}As$ electron-drifting layer, and an undoped GaAs electron-supplying layer are formed in order on a GaAs substrate. An impurity-doped layer δ-doped with Si donor is formed in the GaAs electron-supplying layer. An n-$Al_{0.22}Ga_{0.78}As$ layer and n$^+$-GaAs cap layers are formed in order on the GaAs electron-supplying layer. A source electrode and a drain electrode are formed on the n$^+$-GaAs cap layers and a gate electrode is formed on the n-$Al_{0.22}Ga_{0.78}As$ layer.

15 Claims, 4 Drawing Sheets

1

FIELD-EFFECT SEMICONDUCTOR DEVICE HAVING HETEROJUNCTION

BACKGROUND OF THE INVENTION

1. Field of the Invention

The present invention relates to a field-effect semiconductor device including a heterojunction formed of a semiconductor having a large forbidden band and a semiconductor having a small forbidden band.

2. Description of the Background Art

FIG. 6 is a schematic sectional view showing the structure of a conventional HEMT (High Electron Mobility Transistor).

In FIG. 6, an n-$Al_{0.22}Ga_{0.78}As$ layer 22 with film thickness 20 nm, an undoped $Al_{0.22}Ga_{0.78}As$ layer 23 with film thickness 2 nm, an undoped $In_{0.2}Ga_{0.8}As$ channel layer 24 with film thickness 5 nm, and an undoped $Al_{0.22}Ga_{0.78}As$ layer 25 with film thickness 2 nm are formed in order on a semi-insulating GaAs substrate 21. The carrier concentration of the n-$Al_{0.22}Ga_{0.78}As$ layer 22 is $2\times10^{18}$ cm$^{-3}$.

On the $Al_{0.22}Ga_{0.78}As$ layer 25, an n-$Al_{0.22}Ga_{0.78}As$ electron-supplying layer 26 with film thickness 35 nm and n$^+$-GaAs cap layers 27 with film thickness 80 nm are formed in order. The carrier concentration of the n-$Al_{0.22}Ga_{0.78}As$ electron-supplying layer 26 is $2\times10^{18}$ cm$^{-3}$ and the carrier concentration of the n$^+$-GaAs cap layers 27 is $4\times10^{18}$ cm$^{-3}$.

A concave reaching the n-$Al_{0.22}Ga_{0.78}As$ electron-supplying layer 26 is formed in the center of the n$^+$-GaAs cap layers 27, and a gate electrode 28 in Schottky contact with the n-$Al_{0.22}Ga_{0.78}As$ electron-supplying layer 26 is formed on the center of this electron-supplying layer 26. On the n$^+$-GaAs cap layers 27 on both sides of the gate electrode 28, a source electrode 29 and a drain electrode 30 in ohmic contact with the cap layers 27 are formed, respectively. The gate length of the gate electrode 28 is 0.25 µm, for example.

FIG. 7 shows a schematic energy band diagram of the conduction band right under the gate electrode 28 in the HEMT of FIG. 6.

The forbidden band gap of the $In_{0.2}Ga_{0.8}As$ channel layer 24 is smaller than the forbidden band gaps of the n-$Al_{0.22}Ga_{0.78}As$ layer 22, the $Al_{0.22}Ga_{0.78}As$ layer 23, the $Al_{0.22}Ga_{0.78}As$ layer 25 and the n-$Al_{0.22}Ga_{0.78}As$ electron-supplying layer 26, and a quantum well is formed in the $In_{0.2}Ga_{0.8}As$ channel layer 24.

In this HEMT, when a voltage is applied between the source electrode 29 and the drain electrode 30, electrons supplied from the n-$Al_{0.22}Ga_{0.78}As$ layer 22 and the n-$Al_{0.22}Ga_{0.78}As$ electron-supplying layer 26 drift in the undoped $In_{0.2}Ga_{0.8}As$ channel layer 24. The electrons confined in the quantum well formed in the undoped $In_{0.2}Ga_{0.8}As$ channel layer 24, which are not affected so much by impurities in the highly doped n-$Al_{0.22}Ga_{0.78}As$ electron-supplying layer 26, can drift at high velocity. This enables high-speed operation.

In the above-described conventional HEMT, with a high electric field, a part of the electrons drift in the n-$Al_{0.22}Ga_{0.78}As$ layer 22 and the n-$Al_{0.22}Ga_{0.78}As$ electron-supplying layer 26. The electron velocity in AlGaAs is smaller than the electron velocities in GaAs and InGaAs. Accordingly, in the conventional HEMT, the electron velocity attains its maximum at a certain electric field and becomes smaller as the electric field becomes higher. Hence, although the electron velocity is large in the portion where the electric field has a certain value in the device, the electron velocity becomes smaller in the portion with a high electric field, resulting in a small mean electron velocity. As a result, there is a limit in high-speed characteristics.

Furthermore, generally, the maximum carrier concentration of AlGaAs having a large forbidden band gap is about $2\times10^{18}$ cm$^{-3}$, which is low as compared with the maximum carrier concentration 6 to $8\times10^{18}$ cm$^{-3}$ of GaAs having a small forbidden band gap. Accordingly, the carrier concentration of the n-$Al_{0.22}Ga_{0.78}As$ electron-supplying layer 26 can not be made very high and the number of electrons drifting in the $In_{0.2}Ga_{0.8}As$ channel layer 24 is limited. As a result, the current value, which is in proportion to the product of the number of electrons and the electron velocity, can not be made large, and the high-power characteristics are also limited.

SUMMARY OF THE INVENTION

It is an object of the present invention to provide a field-effect semiconductor device with improved high-speed characteristics and high-power characteristics.

A field-effect semiconductor device according to the present invention includes a first semiconductor layer, a second semiconductor layer, a third semiconductor layer and a fourth semiconductor layer in this order, the third semiconductor layer having a forbidden band gap smaller than that of the fourth semiconductor layer, the second semiconductor layer having a forbidden band gap smaller than those of the first semiconductor layer and the third semiconductor layer, the third semiconductor layer having a property of having a maximum carrier concentration higher than that of the fourth semiconductor layer and having an electron velocity larger than that of the fourth semiconductor layer, the second semiconductor layer having an electron velocity larger than that of the third semiconductor layer, the second and third semiconductor layers forming a quantum well, the third semiconductor layer having an impurity-doped layer doped with impurity elements of one conductivity type formed therein.

Here, the maximum carrier concentration is the maximum concentration, dopable in semiconductor, of carriers contributing to the electrical conduction, which differs according to semiconductor material species.

In that field-effect semiconductor device, the impurity-doped layer provided in the third semiconductor layer works as a carrier-supplying layer and the second semiconductor layer and the third semiconductor layer work as carrier-drifting layers.

The carriers supplied from the impurity-doped layer mainly drift in the second semiconductor layer having the largest electron velocity, so that the drifting velocity of the electrons is high. Also, part of the carriers drift in the third semiconductor layer having its electron velocity larger than those of the first semiconductor layer and the fourth semiconductor layer. Accordingly, high velocity performance of carriers is maintained in a wide electric-field range.

Furthermore, since the impurity-doped layer is provided in the third semiconductor layer having the maximum carrier concentration larger than that of the fourth semiconductor layer, the carrier concentration in the impurity-doped layer can be made higher. Hence, the number of carriers drifting in the second semiconductor layer is increased to enhance the high-power characteristics. Moreover, since the second semiconductor layer and the third semiconductor layer form a quantum well, the carriers locally exist in the quantum well, not affected by adjacent layers, and not scattered.

Accordingly, a field-effect semiconductor device with improved high-speed characteristics and high-power characteristics is obtained.

Particularly, it is preferred that the second semiconductor layer is an undoped layer. In this case, carriers can drift at higher velocity because they are not subjected to scattering due to impurities.

The impurity-doped layer may be provided in part of the thickness direction of the third semiconductor layer, or may be provided over the entirety of the thickness direction of the third semiconductor layer.

Particularly, the field-effect semiconductor device may further include a fifth semiconductor layer provided between the first semiconductor layer and the second semiconductor layer, having a forbidden band gap smaller than that of the first semiconductor layer and larger than that of the second semiconductor layer and having an electron velocity larger than that of the first semiconductor layer. Then carriers overflowing the second semiconductor layer drift in the fifth semiconductor layer. In this case, since the electron velocity in the fifth semiconductor layer is larger than the electron velocity in the first semiconductor layer, high-speed performance of the carriers is maintained.

The second semiconductor layer may be formed of an undoped compound semiconductor including indium, gallium, and arsenic, the third semiconductor layer may be formed of an undoped compound semiconductor including gallium and arsenic, and the fourth semiconductor layer may be formed of a one conductivity type or undoped compound semiconductor including aluminum, gallium and arsenic or a one conductivity type or undoped compound semiconductor including indium, gallium and phosphorus.

The first semiconductor layer may be formed of an undoped compound semiconductor including aluminum, gallium and arsenic or an undoped compound semiconductor including gallium and arsenic. The first semiconductor layer may include AlGaAs or GaAs, the second semiconductor layer may include InGaAs, the third semiconductor layer may include GaAs, the fourth semiconductor layer may include AlGaAs or InGaP and the impurity element of the one conductivity type may be Si.

The second semiconductor layer may be formed of an undoped compound semiconductor including indium, gallium and arsenic, the third semiconductor layer may be formed of an undoped compound semiconductor including indium, gallium and arsenic, and the fourth semiconductor layer may be formed of a one conductivity type or undoped compound semiconductor including indium, aluminum and arsenic. The first semiconductor layer may be formed of an undoped compound semiconductor including indium, aluminum and arsenic.

The first semiconductor layer may include InAlAs, the second semiconductor layer may include $In_xGa_{1-x}As$, the third semiconductor layer may include $In_yGa_{1-y}As$, where $0<Y<X<1$, the fourth semiconductor layer may include InAlAs, and the impurity element of the one conductivity type may be Si.

The fifth semiconductor layer may be formed of an undoped compound semiconductor including gallium and arsenic. The fifth semiconductor layer may include GaAs.

It is preferred that the impurity-doped layer is formed by δ doping. Then the impurity-doped layer is formed in a thin region in the third semiconductor layer, so that the carriers drifting in the third semiconductor layer are not subjected to scattering in the region except the impurity-doped layer in the third semiconductor layer so that they can drift at higher velocity.

The field-effect semiconductor device may further include first and second ohmic electrodes spaced from each other on the fourth semiconductor layer and a Schottky electrode provided between the first and second ohmic electrodes on the fourth semiconductor layer. Then, when a voltage is applied between the first and second ohmic electrodes, carriers are supplied from the impurity-doped layer into the second semiconductor layer, which drift in the second semiconductor layer. The field-effect semiconductor device may further include sixth semiconductor layers provided between the fourth semiconductor layer and the first ohmic electrode and between the fourth semiconductor layer and the second ohmic electrode, respectively, and highly doped with impurity elements of the one conductivity type.

A field-effect semiconductor device according to another aspect of the present invention includes a first semiconductor layer, a second semiconductor layer in which electrons drift at high velocity, a third semiconductor layer doped like a layer with impurity elements of one conductivity type in its entirety or in part of a thickness direction and a fourth semiconductor layer in this order, the second and third semiconductor layers forming a quantum well.

The field-effect semiconductor device may further include a fifth semiconductor layer provided between the first semiconductor layer and the second semiconductor layer, having a forbidden band gap smaller than that of the first semiconductor layer and larger than that of the second semiconductor layer and having an electron velocity larger than that of the first semiconductor layer.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
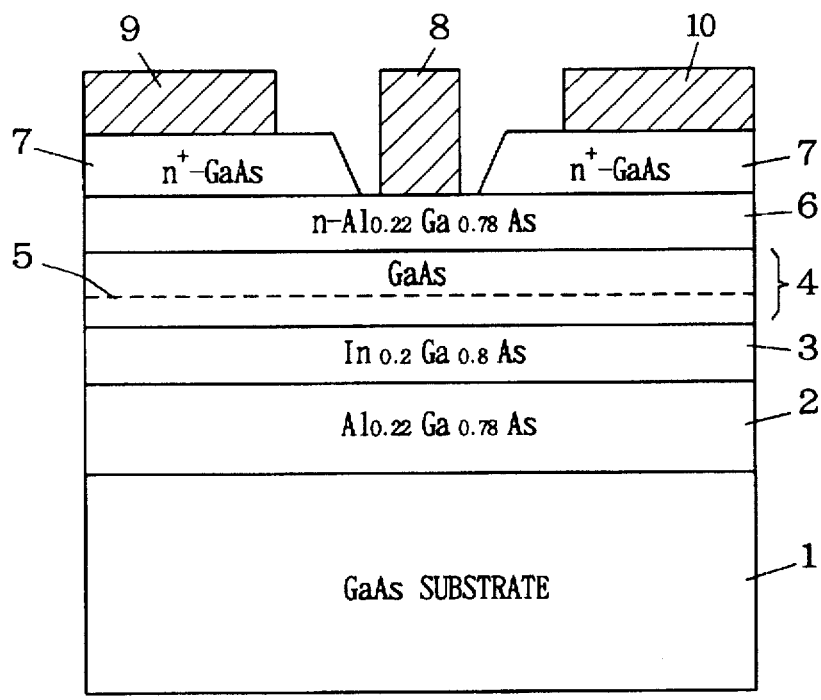
FIG. 1 is a schematic sectional view showing the structure of a field-effect semiconductor device according to a first embodiment of the present invention.

FIG. 1 is a schematic sectional view showing the structure of a field-effect semiconductor device according to a first embodiment of the present invention. This semiconductor device is an AlGaAs/GaAs/InGaAs system semiconductor device.

In FIG. 1, on a semi-insulating GaAs substrate 1, an undoped $Al_{0.22}Ga_{0.78}As$ layer 2 with film thickness 100 nm, an undoped $In_{0.2}Ga_{0.8}As$ electron-drifting layer 3 with film thickness 5 nm, and an undoped GaAs electron-supplying layer 4 with film thickness 15 nm are formed in order. An impurity-doped layer 5 δ-doped (atomic planar doped) with Si for one molecular layer is formed in the GaAs electron-supplying layer 4. The carrier concentration of the impurity-doped layer 5 is $6 \times 10^{12}$ cm$^{-2}$.

On the GaAs electron-supplying layer 4, an n-Al$_{0.22}$Ga$_{0.78}$As layer 6 with film thickness 25 nm and n$^+$-GaAs cap layers 7 with film thickness 80 nm are formed in order. The carrier concentration of the n-Al$_{0.22}$Ga$_{0.78}$As layer 6 is $2 \times 10^{18}$ cm$^{-3}$ and the carrier concentration of the n$^+$-GaAs cap layer 7 is $4 \times 10^{18}$ cm$^{-3}$.

A concave reaching the n-Al$_{0.22}$Ga$_{0.78}$As layer 6 is formed in the center of the n$^+$-GaAs cap layers 7, and a gate electrode 8 in Schottky contact with the n-Al$_{0.22}$Ga$_{0.78}$As layer 6 is formed in the center on the n-Al$_{0.22}$Ga$_{0.78}$As layer 6. A source electrode 9 and a drain electrode 10 in ohmic contact with the n$^+$-GaAs cap layers 7 are formed on the cap layers 7 on both sides of the gate electrode 8, respectively. The gate length of the gate electrode 8 is 0.25 μm, for example.

Figure 2:
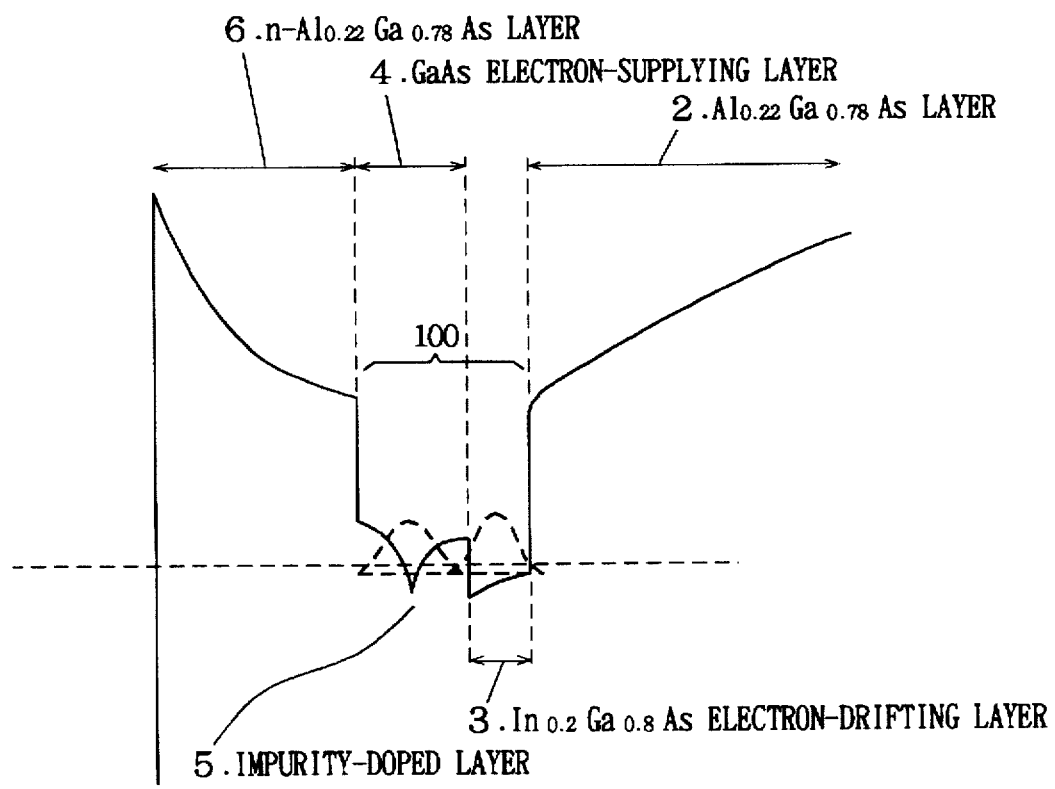
FIG. 2 is a schematic energy band diagram of a conduction band in the field-effect semiconductor device of FIG. 1.

FIG. 2 shows a schematic energy band diagram of the conduction band right under the gate electrode 8 in the field-effect semiconductor device of FIG. 1.

The forbidden band gap of the GaAs electron-supplying layer 4 is smaller than the forbidden band gaps of the Al$_{0.22}$Ga$_{0.78}$As layer 2 and the n-Al$_{0.22}$Ga$_{0.78}$As layer 6 and the forbidden band gap of the In$_{0.2}$Ga$_{0.8}$As electron-drifting layer 3 is smaller than the forbidden band gap of the GaAs electron-supplying layer 4. This forms a quantum well 100 between the Al$_{0.22}$Ga$_{0.78}$As layer 2 and the n-Al$_{0.22}$Ga$_{0.78}$As layer 6 and an electron-supplying layer and an electron-drifting layer (channel layer) are formed in the quantum well 100. The electron affinity of the GaAs electron-supplying layer 4 is larger than the electron affinities of the Al$_{0.22}$Ga$_{0.78}$As layer 2 and the n-Al$_{0.22}$Ga$_{0.78}$As layer 6 and the electron affinities of the impurity-doped layer 5 and the In$_{0.2}$Ga$_{0.8}$As electron-drifting layer 3 are larger than the electron affinity of the GaAs electron-supplying layer 4.

In the field-effect semiconductor device of this embodiment, when a voltage is applied between the source electrode 9 and the drain electrode 10, electrons supplied from the impurity-doped layer 5 mainly drift in the In$_{0.2}$Ga$_{0.8}$As electron-drifting layer 3. The electron velocity in InGaAs is larger than the electron velocity in AlGaAs and the electron velocity in GaAs, so that the electrons can drift at high velocity in the In$_{0.2}$Ga$_{0.8}$As electron-drifting layer 3. A part of the electrons drift in the GaAs electron-supplying layer 4. The electron velocity in GaAs is larger than the electron velocity in AlGaAs, so that the electrons in the GaAs electron-supplying layer 4 can also drift at high velocity.

Figure 3:
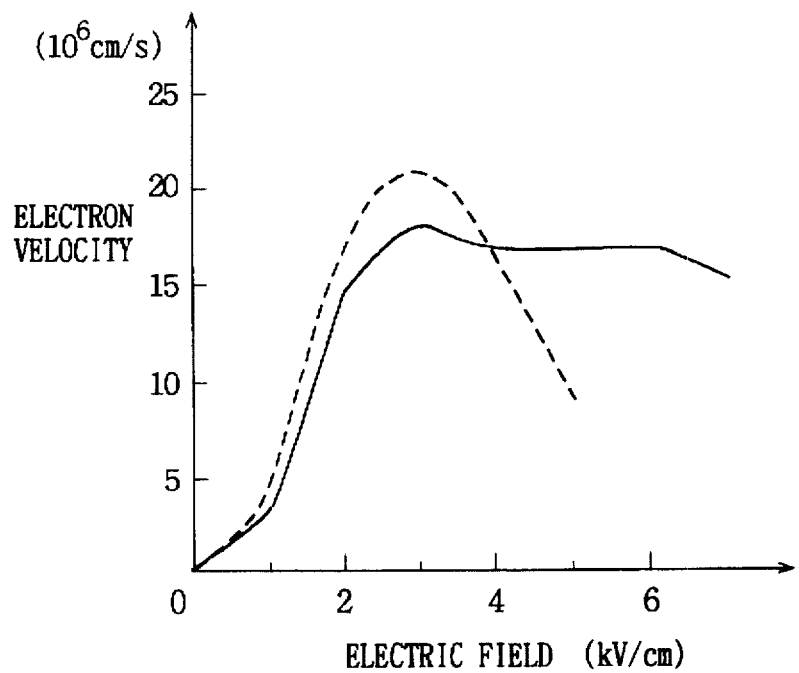
FIG. 3 is a diagram showing the relation between the electric field and the electron velocity in the field-effect semiconductor device of FIG. 1 and a conventional HEMT.

FIG. 3 shows the relation between the electric field and the electron velocity in the field-effect semiconductor device of this embodiment and a conventional HEMT.

In the conventional HEMT, as shown by the broken line in FIG. 3, the electron velocity attains its maximum at a certain electric field and the electron velocity becomes smaller as the electric field becomes higher. On the other hand, in the field-effect semiconductor device of this embodiment, as shown by the solid line in the figure, the electron velocity is large over a wide range from the low electric field to the high electric field.

In this way, in the field-effect semiconductor device of this embodiment, the high velocity of electrons is maintained in a wide electric-field range, providing a large mean electron velocity. This results in improvements in high-speed characteristics.

Furthermore, the maximum carrier concentration of GaAs is higher than that of AlGaAs, so that a high-concentration impurity-doped layer 5 can be formed in the GaAs electron-supplying layer 4. Accordingly, the number of carriers drifting in the In$_{0.2}$Ga$_{0.8}$As electron-drifting layer 3 increases and the current value, which is in proportion to the product of the electron velocity and the number of electrons, can be increased. This results in improvements in high-power characteristics.

Figure 4:
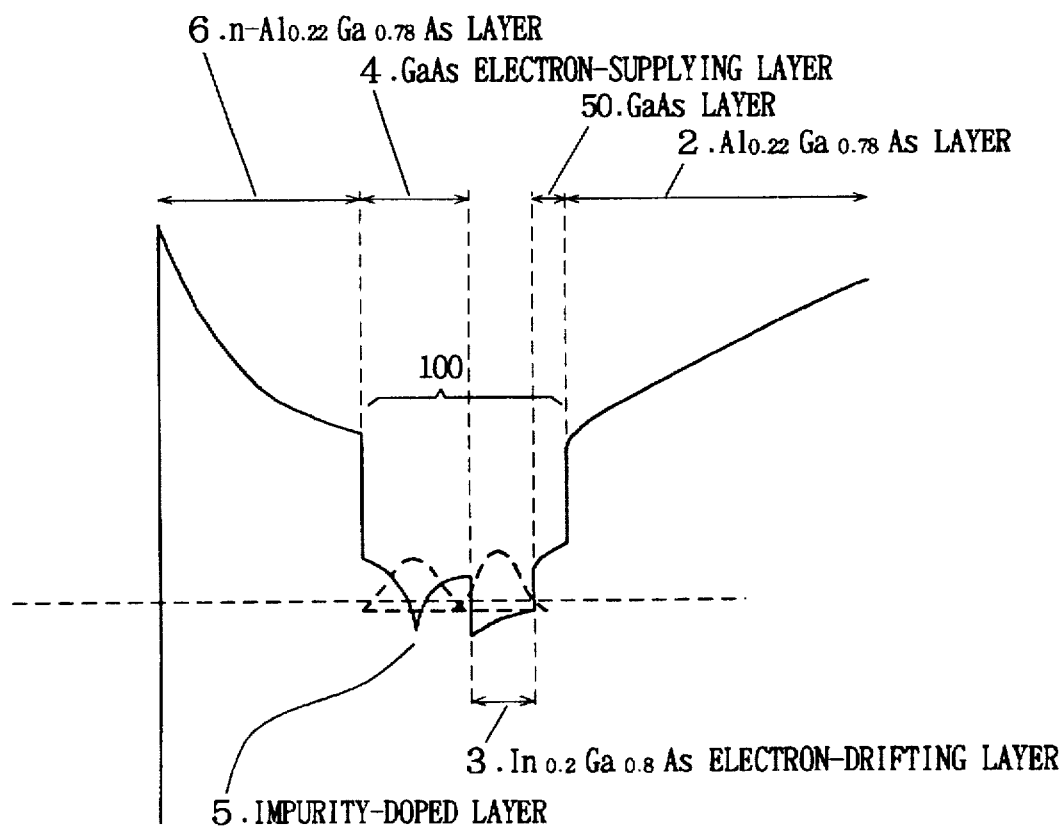
FIG. 4 is a schematic energy band diagram showing another structural example of the field-effect semiconductor device according to the first embodiment of the present invention.

As shown in the energy band diagram of FIG. 4, an undoped GaAs layer 50 may be provided between the Al$_{0.22}$Ga$_{0.78}$As layer 2 and the In$_{0.2}$Ga$_{0.8}$As electron-drifting layer 3. Since the electron velocity in GaAs is larger than the electron velocity in AlGaAs, even if electrons overflow the In$_{0.2}$Ga$_{0.8}$As electron-drifting layer 3, the electrons can drift at high velocity in the GaAs layer 50. Accordingly, the high velocity of electrons is maintained.

Figure 5:
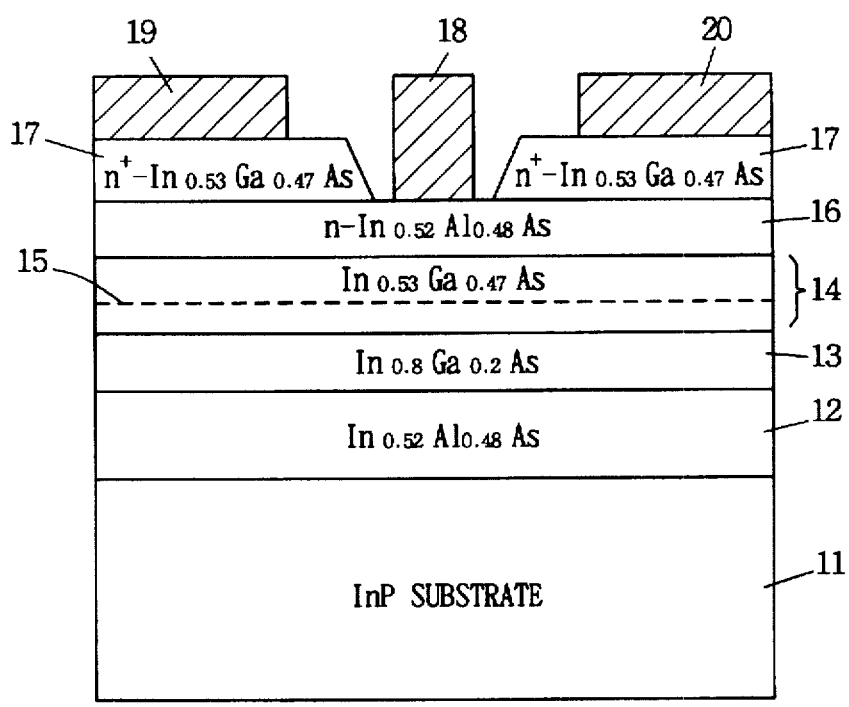
FIG. 5 is a schematic sectional view showing the structure of a field-effect semiconductor device according to a second embodiment of the present invention.

FIG. 5 is a schematic sectional view showing the structure of a field-effect semiconductor device according to a second embodiment of the present invention. This semiconductor device is an InAlAs/InGaAs system semiconductor device.

In FIG. 5, on the semi-insulating InP substrate 11, an undoped In$_{0.52}$Al$_{0.48}$As layer 12 with film thickness 100 nm, an undoped In$_{0.8}$Ga$_{0.2}$As electron-drifting layer 13 with film thickness 5 nm and an undoped In$_{0.53}$Ga$_{0.47}$As electron-supplying layer 14 with film thickness 15 nm are formed in order. An impurity-doped layer 15 which is δ-doped with Si donor for one molecular layer is provided in the In$_{0.53}$Ga$_{0.47}$As electron-supplying layer 14. The carrier concentration of the impurity-doped layer 15 is $6 \times 10^{12}$ cm$^{-2}$.

On the In$_{0.53}$Ga$_{0.47}$As electron-supplying layer 14, an n-In$_{0.52}$Al$_{0.48}$As layer 16 with film thickness 25 nm and n$^+$-In$_{0.53}$Ga$_{0.47}$As cap layers 17 with film thickness 50 nm are formed in order. The carrier concentration of the n-In$_{0.52}$Al$_{0.48}$As layer 16 is $1 \times 10^{18}$ cm$^{-3}$ and the carrier concentration of the n$^+$-In$_{0.53}$Ga$_{0.47}$As cap layer 17 is $8 \times 10^{18}$ cm$^{-3}$.

A concave reaching the n-In$_{0.52}$Al$_{0.48}$As layer 16 is formed in the center of the n$^+$-In$_{0.53}$Ga$_{0.47}$As cap layers 17, and a gate electrode 18 in Schottky contact with the n-In$_{0.52}$Al$_{0.48}$As layer 16 is formed in the center on the n-In$_{0.52}$Al$_{0.48}$As layer 16. A source electrode 19 and a drain electrode 20 in ohmic contact with the n$^+$-In$_{0.53}$Ga$_{0.47}$As cap layers 17 are respectively formed on the cap layers 17 on both sides of the gate electrode 18. The gate length of the gate electrode 18 is 0.45 μm, for example.

In the field-effect semiconductor device of this embodiment, when a voltage is applied between the source electrode 19 and the drain electrode 20, electrons supplied from the impurity-doped layer 15 mainly drift in the In$_{0.8}$Ga$_{0.2}$As electron-drifting layer 13. The electron velocity in In$_{0.8}$Ga$_{0.2}$As is larger than the electron velocity in In$_{0.52}$Al$_{0.48}$As and the electron velocity in In$_{0.53}$Ga$_{0.47}$As, so that the electrons can drift at high velocity in the In$_{0.8}$Ga$_{0.2}$As electron-drifting layer 13. A part of the electrons drift in the In$_{0.53}$Ga$_{0.47}$As electron-supplying layer 14. Since the electron velocity in In$_{0.53}$Ga$_{0.47}$As is larger than the electron velocity in In$_{0.52}$Al$_{0.48}$As, the electrons in the In$_{0.53}$Ga$_{0.47}$As electron-supplying layer 14 can also drift at high velocity. Accordingly, the high velocity performance of electrons is maintained in a wide electric-field range and the mean electron velocity is increased. This results in improvements in high-speed characteristics.

Furthermore, since the maximum carrier concentration in InGaAs is higher than that of InAlAs, a high-concentration impurity-doped layer 15 can be formed in the In$_{0.53}$Ga$_{0.47}$As electron-supplying layer 14. Accordingly, the number of carriers drifting in the $In_{0.8}Ga_{0.2}As$ electron-drifting layer 13 increases and the current value in proportion to the product of the electron velocity and the number of electrons can be increased. This results in improvements in high-power characteristics.

Figure 6:
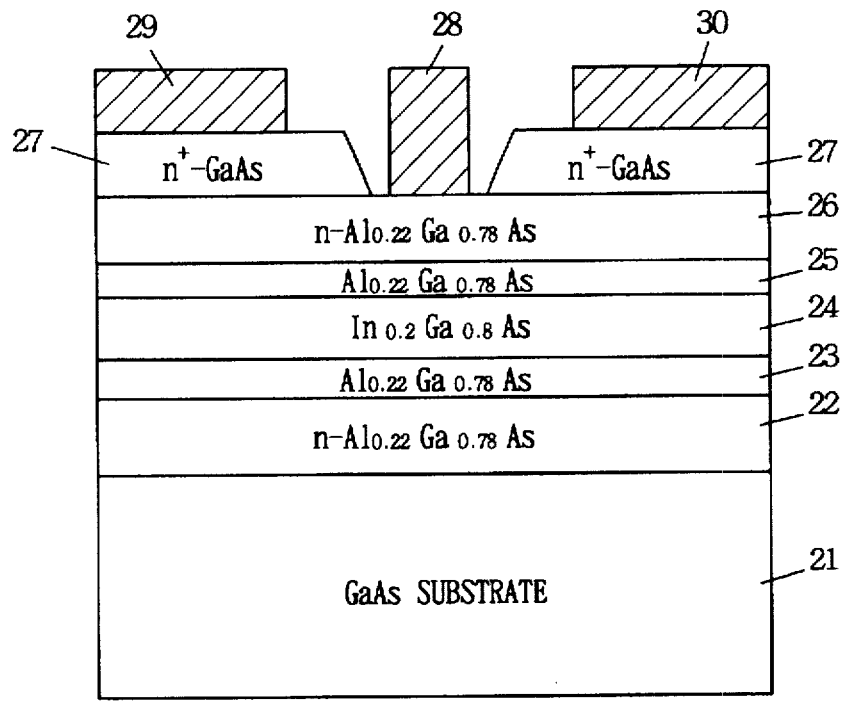
FIG. 6 is a schematic sectional view showing the structure of the conventional HEMT.
Figure 7:
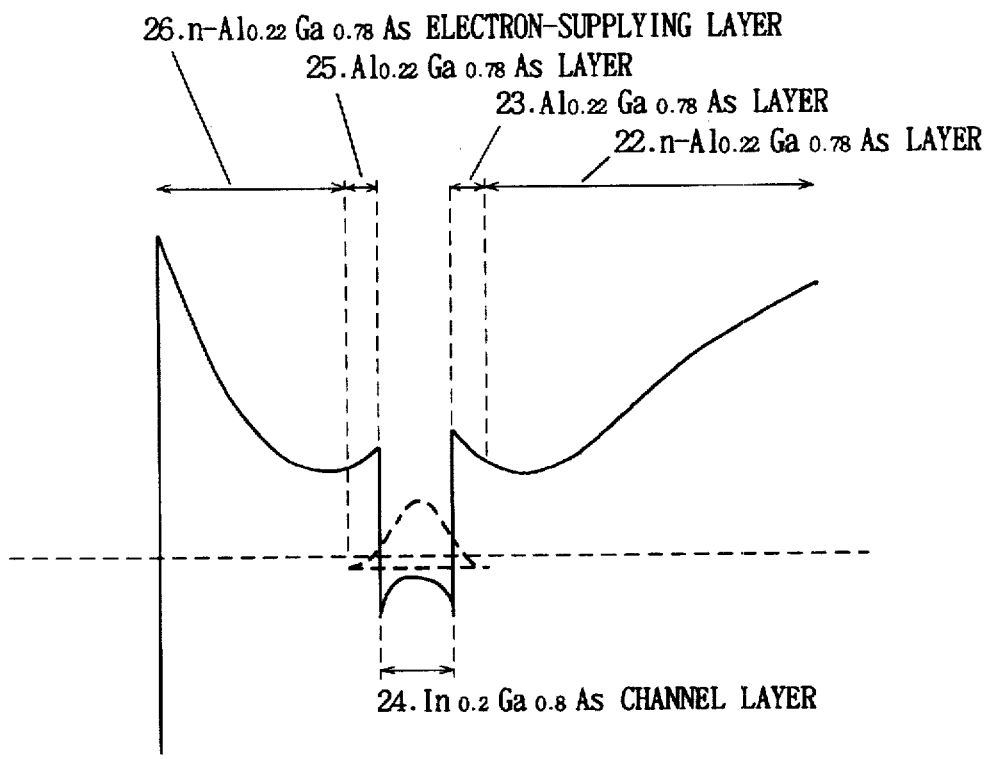
FIG. 7 is a schematic energy band diagram of the conduction band in the HEMT of FIG. 6.

Now, the semiconductor device of the first embodiment shown in FIG. 1, the semiconductor device of the second embodiment shown in FIG. 5 and the conventional HEMT shown in FIG. 6 were fabricated and the current gain cut-off frequency, the maximum oscillation frequency and the power density at 40 GHz were measured. The gate length in the semiconductor device of the first embodiment and the HEMT of the conventional example was 0.25 μm and the gate length of the semiconductor device of the second embodiment was 0.45 μm. The measured results are shown in Table 1.

TABLE 1

| Characteristics | First embodiment | Second embodiment | Conventional example |
|---|---|---|---|
| Current gain cut-off frequency (GHz) | 65 | 50 | 45 |
| Maximum oscillation frequency (GHz) | 140 | 135 | 115 |
| Power density [40 GHz] (W/mm) | 1.0 | 0.8 | 0.75 |

As shown in Table 1, in the semiconductor devices of the first and second embodiments, the current gain cut-off frequency and the maximum oscillation frequency are higher than those of the HEMT of the conventional example, and the power density at 40 GHz is also larger than that of the HEMT of the conventional example. In this way, it is seen that the high-frequency characteristics and the high-power characteristics are improved in the semiconductor devices of the first and second embodiments as compared with the HEMT of the conventional example.

Although the impurity-doped layers 5 and 15 are formed by δ-doping the undoped electron-supplying layers 4 and 14 with impurity elements in the above-described embodiments, the entirety of the electron-supplying layers 4 and 14 may be doped with impurity elements. However, it is preferred to δ dope the undoped electron-supplying layers 4, 14 with impurity elements because then carriers are not liable to scattering due to impurities.

Also, in the first embodiment, a GaAs buffer layer may be provided in place of the $Al_{0.22}Ga_{0.78}As$ layer 2.

Furthermore, in the first embodiment, an InGaP layer may be provided instead of the n-$Al_{0.22}Ga_{0.78}As$ layer 6.

While the invention has been described in detail, the foregoing description is in all aspects illustrative and not restrictive. It is understood that numerous other modifications and variations can be devised without departing from the scope of the invention.

We claim:

1. A field-effect semiconductor device, comprising:
    a first semiconductor layer, a fifth semiconductor layer, a second semiconductor layer which is undoped, a third semiconductor layer and a fourth semiconductor layer in this order,
    wherein said third semiconductor layer has a forbidden band gap smaller than that of said fourth semiconductor layer,
    said second semiconductor layer has a forbidden band gap smaller than those of said first semiconductor layer and said third semiconductor layer,
    said fifth semiconductor layer has a forbidden band gap smaller than that of said first semiconductor layer and larger than that of said second semiconductor layer, and having an electron velocity larger than that of said first semiconductor layer,
    said third semiconductor layer has a property of having a maximum carrier concentration higher than that of said fourth semiconductor layer and has an electron velocity larger than that of said fourth semiconductor layer,
    said second semiconductor layer has an electron velocity larger than that of said third semiconductor layer,
    a quantum well formed between said first and fourth semiconductor layers, said second semiconductor layer serves as an electron-drifting layer said third semiconductor layer serves as an electron-supplying layer, and said electron-drifting layer and said electron-supplying layer are formed in the quantum well, and
    an impurity-doped layer doped with impurity elements of one conductivity type is provided in part or over the entirety of a thickness direction of said third semiconductor layer.

2. The field-effect semiconductor device according to claim 1, wherein
    said second semiconductor layer is formed of an undoped compound semiconductor including indium, gallium and arsenic,
    said third semiconductor layer is formed of an undoped compound semiconductor including gallium and arsenic, and
    said fourth semiconductor layer is formed of a compound semiconductor of the one conductivity type or undoped including aluminum, gallium and arsenic or a compound semiconductor of the one conductivity type or undoped including indium, gallium and phosphorus.

3. The field-effect semiconductor device according to claim 2, wherein said first semiconductor layer is formed of an undoped compound semiconductor including aluminum, gallium and arsenic, or an undoped compound semiconductor including gallium and arsenic.

4. The field-effect semiconductor device according to claim 3, wherein said first semiconductor layer includes AlGaAs or GaAs, said second semiconductor layer includes InGaAs, said third semiconductor layer includes GaAs, said fourth semiconductor layer includes AlGaAs or InGaP, and said impurity elements of the one conductivity type are Si.

5. The field-effect semiconductor device according to claim 1, wherein
    said second semiconductor layer is formed of an undoped compound semiconductor including indium, gallium and arsenic,
    said third semiconductor layer is formed of an undoped compound semiconductor including indium, gallium and arsenic, and
    said fourth semiconductor layer is formed of a compound semiconductor of the one conductivity type or undoped including indium, aluminum and arsenic.

6. The field-effect semiconductor device according to claim 5, wherein said first semiconductor layer is formed of an undoped compound semiconductor including indium, aluminum and arsenic.

7. The field-effect semiconductor device according to claim 6, wherein said first semiconductor layer includes InAlAs, said second semiconductor layer includes $In_xGa_{1-x}As$, said third semiconductor layer includes $In_yGa_{1-y}As$, where $0<Y<X<1$, said fourth semiconductor layer includes InAlAs, and said impurity elements of the one conductivity type are Si.

8. The field-effect semiconductor device according to claim 1, wherein said second semiconductor layer is formed of an undoped compound semiconductor including indium, gallium and arsenic, said third semiconductor layer is formed of an undoped compound semiconductor including gallium and arsenic, said fourth semiconductor layer is formed of a compound semiconductor of the one conductivity type or undoped including aluminum, gallium and arsenic or a compound semiconductor of the one conductivity type or undoped including indium, gallium and phosphorus, and said fifth semiconductor layer is formed of an undoped compound semiconductor including gallium and arsenic.

9. The field-effect semiconductor device according to claim 8, wherein said first semiconductor layer is formed of an undoped compound semiconductor including aluminum, gallium and arsenic.

10. The field-effect semiconductor device according to claim 9, wherein said first semiconductor layer includes AlGaAs, said second semiconductor layer includes InGaAs, said third semiconductor layer includes GaAs, said fourth semiconductor layer includes AlGaAs or InGaP, said fifth semiconductor layer includes GaAs and said impurity elements of the one conductivity type are Si.

11. The field-effect semiconductor device according to claim 1, wherein said impurity-doped layer is formed by δ doping.

12. The field-effect semiconductor device according to claim 1, further comprising first and second ohmic electrodes spaced from each other on said fourth semiconductor layer, and a Schottky electrode provided between said first and second ohmic electrodes on said fourth semiconductor layer.

13. The field-effect semiconductor device according to claim 12, further comprising sixth semiconductor layers provided between said fourth semiconductor layer and said first ohmic electrode and between said fourth semiconductor layer and said second ohmic electrode, respectively, and highly doped with impurity elements of the one conductivity type.

14. The field-effect semiconductor device according to claim 1, further comprising first and second ohmic electrodes spaced from each other on said fourth semiconductor layer, and a Schottky electrode provided between said first and second ohmic electrodes on said fourth semiconductor layer.

15. The field-effect semiconductor device according to claim 14, further comprising sixth semiconductor layers provided between said fourth semiconductor layer and said first ohmic electrode and between said fourth semiconductor layer and said second ohmic electrode, respectively, and highly doped with impurity elements of the one conductivity type.

* * * * *